United States Patent
Jung et al.

(10) Patent No.: US 10,986,761 B2
(45) Date of Patent: Apr. 20, 2021

(54) BOARD INSPECTING APPARATUS AND BOARD INSPECTING METHOD USING THE SAME

(71) Applicant: KOH YOUNG TECHNOLOGY INC., Seoul (KR)

(72) Inventors: Seung Won Jung, Seoul (KR); Jong Jin Choi, Gwangmyeong-si (KR)

(73) Assignee: KOH YOUNG TECHNOLOGY INC., Seoul (KR)

( * ) Notice: Subject to any disclaimer, the term of this patent is extended or adjusted under 35 U.S.C. 154(b) by 241 days.

(21) Appl. No.: 16/343,528

(22) PCT Filed: Sep. 25, 2017

(86) PCT No.: PCT/KR2017/010545
§ 371 (c)(1),
(2) Date: Apr. 19, 2019

(87) PCT Pub. No.: WO2018/074755
PCT Pub. Date: Apr. 26, 2018

(65) Prior Publication Data
US 2019/0335633 A1    Oct. 31, 2019

(30) Foreign Application Priority Data

Oct. 20, 2016    (KR) .......................... 10-2016-0136150

(51) Int. Cl.
| | | |
|---|---|---|
| G01B 11/24 | (2006.01) | |
| H05K 13/08 | (2006.01) | |
| G01N 21/956 | (2006.01) | |

(52) U.S. Cl.
CPC ......... *H05K 13/0818* (2018.08); *G01B 11/24* (2013.01); *G01N 21/956* (2013.01);
(Continued)

(58) Field of Classification Search
CPC ............... H05K 13/08; H05K 13/0815; H05K 13/0818; H05K 13/085; G01B 11/24; G01N 2021/95638; G01N 21/956
See application file for complete search history.

(56) References Cited

FOREIGN PATENT DOCUMENTS

| EP | 0 336 563 | 10/1989 |
|---|---|---|
| EP | 2 765 843 | 8/2014 |

(Continued)

OTHER PUBLICATIONS

Supplementary Search report corresponding to European Patent Application No. 17861252.9, dated Oct. 1, 2019.
(Continued)

*Primary Examiner* — Hina F Ayub
(74) *Attorney, Agent, or Firm* — Kile Park Reed & Houtteman PLLC

(57) ABSTRACT

The board inspecting apparatus include a measuring section obtaining measurement data for at least a portion of a board, a processing section comparing the measurement data and pre-obtained reference data, based on feature objects set on the board, to perform warpage compensation and inspecting the board with warpage compensated, a display section displaying ranges adjusting a first level of an inspection speed and a second level of a precision of the warpage compensation, and an input section receiving, from a user, inputs for the first and second levels as a specific setting combination having a trade-off relationship. The processing section, when the inspection speed and the precision are established, designates a specific option corresponding to the inspection speed and the precision among options increasing the precision so that the specific option is applied. Thus, users' convenience may be improved, and users may easily set options for distortion compensation.

6 Claims, 3 Drawing Sheets

(52) U.S. Cl.
CPC ......... *H05K 13/08* (2013.01); *H05K 13/0815* (2018.08); *G01N 2021/95638* (2013.01)

(56) References Cited

FOREIGN PATENT DOCUMENTS

| | | |
|---|---|---|
| EP | 3 038 444 | 6/2016 |
| JP | 2008-203034 | 9/2008 |
| JP | 2011-095226 | 5/2011 |
| JP | 2012-047463 | 3/2012 |
| KR | 10-2011-0105512 | 9/2011 |
| KR | 10-1447570 | 10/2014 |
| WO | 2008/137919 | 11/2008 |
| WO | 2015/026212 | 2/2015 |

OTHER PUBLICATIONS

International Search Report for International Application No. PCT/KR2017/010545, dated Jan. 11, 2018.

BOARD INSPECTING APPARATUS AND BOARD INSPECTING METHOD USING THE SAME

TECHNICAL FIELD

The present invention relates to a board inspecting apparatus and a board inspecting method using the same. More particularly, the present invention relates to a board inspecting apparatus inspecting an area in which distortion is compensated and a board inspecting method using the same.

BACKGROUND ART

In general, at least one printed circuit board (PCB) is provided in an electronic device, and various circuit components such as a circuit pattern, a connection pad portion, and a driving chip electrically connected to the connection pad portion are mounted on the printed circuit board.

In general, a board inspecting apparatus is used to verify that the above various circuit components are properly formed or placed on the printed circuit board.

A conventional board inspecting apparatus sets a predetermined inspection area and inspects whether solder is properly formed or specific circuit components are properly installed in the inspection area. In a conventional method of setting the inspection area, an area in which a circuit component should theoretically exist is merely set as an inspection area.

The inspection area should be precisely set to a desired location so that measurement may be performed properly. However, since a measurement target such as a printed circuit board may have distortions such as bending and twisting of a board, a conventional inspection area cannot be accurately set at a desired position, and there is a problem that a certain difference occurs between an image acquired by a camera of an image-capturing part and a position where the circuit component theoretically exists. Therefore, it is necessary to set an inspection area in which distortion of the measurement target as the above is compensated appropriately.

Conventionally, in order to set an inspection area in which distortion of a measurement target is appropriately compensated, there has been made an attempt to acquire and compare reference data and measurement data for the measurement area set on the board and compensate the same to thereby set an accurate inspection area, for example, in Korean Patent No. 10-1132779 of the applicant. However, since there are various options for distortion compensation, it has been difficult for a user to properly use these options.

Thus, a way of supporting a user to easily select options for distortion compensation is required.

DISCLOSURE

Technical Problem

Accordingly, the present invention provides a board inspecting apparatus capable of improving user's convenience, and easily setting options for distortion compensation.

In addition, the present invention also provides a board inspecting method using the above-mentioned board inspecting apparatus.

Technical Solution

According to an exemplary embodiment of the present invention, a board inspecting apparatus include a measuring section obtaining measurement data for at least a portion of a board, a processing section comparing the measurement data of the board and previously obtained reference data of the board, based on a plurality of feature objects set on the board, to perform warpage compensation for the board, and inspecting the board in which warpage is compensated, a display section displaying ranges for adjusting a first level of an inspection speed according to the warpage compensation and a second level of a precision of the warpage compensation, and an input section receiving, from a user, an input for the first level of the inspection speed and the second level of the precision as a setting combination that is specified to have a trade-off relationship. The processing section, when the inspection speed and the precision are established, designates a specific option corresponding to the established inspection speed and the established precision among a plurality options for increasing the precision of the warpage compensation so that the specific option is applied.

In one embodiment, the display section may display the first level and the second level, respectively, as a first step and a second step which are discrete, or as a first weight ratio and a second weight ratio which are continuous.

According to an exemplary embodiment of the present invention, a board inspecting method uses a board inspecting apparatus performing warpage compensation of a board serving as a measurement target and inspecting the board with warpage compensated. The board inspecting method is performed by the board inspecting apparatus. The board inspecting method includes displaying ranges for adjusting a first level of an inspection speed according to the warpage compensation and a second level of a precision of the warpage compensation, receiving, from a user, an input for the first level of the inspection speed and the second level of the precision as a setting combination that is specified to have a trade-off relationship, compensating warpage of the board based on feature object on the board, according to the setting combination of the first level of the inspection speed and the second level of the precision, and inspecting an inspection area of the board in which the warpage is compensated. In compensating warpage of the board, when the inspection speed and the precision are established, a specific option corresponding to the established inspection speed and the established precision among a plurality options for increasing the precision of the warpage compensation is designated so that the specific option is applied.

In one embodiment, when displaying the first level and the second level, the first level and the second level may be respectively displayed as a first step and a second step which are discrete, or a first weight ratio and a second weight ratio which are continuous.

According to an exemplary embodiment of the present invention, a computer readable non-transitory recording medium recording a program implementing the board inspecting method may be provided.

Advantageous Effects

According to the present invention, an interface for selecting an inspection speed and a precision for distortion compensation of a board as a specific setting combination having a trade-off relationship with each other is provided, and a specific option corresponding to the inspection speed and the precision is applied by the selection of the setting combination, thereby improving user's convenience and allowing a user to easily set options for distortion compensation.

In addition, when the inspection speed and the precision are displayed, the level of the inspection speed and the level of the precision are displayed in discrete steps or continuous weight ratios, thereby further improving user's convenience.

MODE FOR INVENTION

Figure 1:
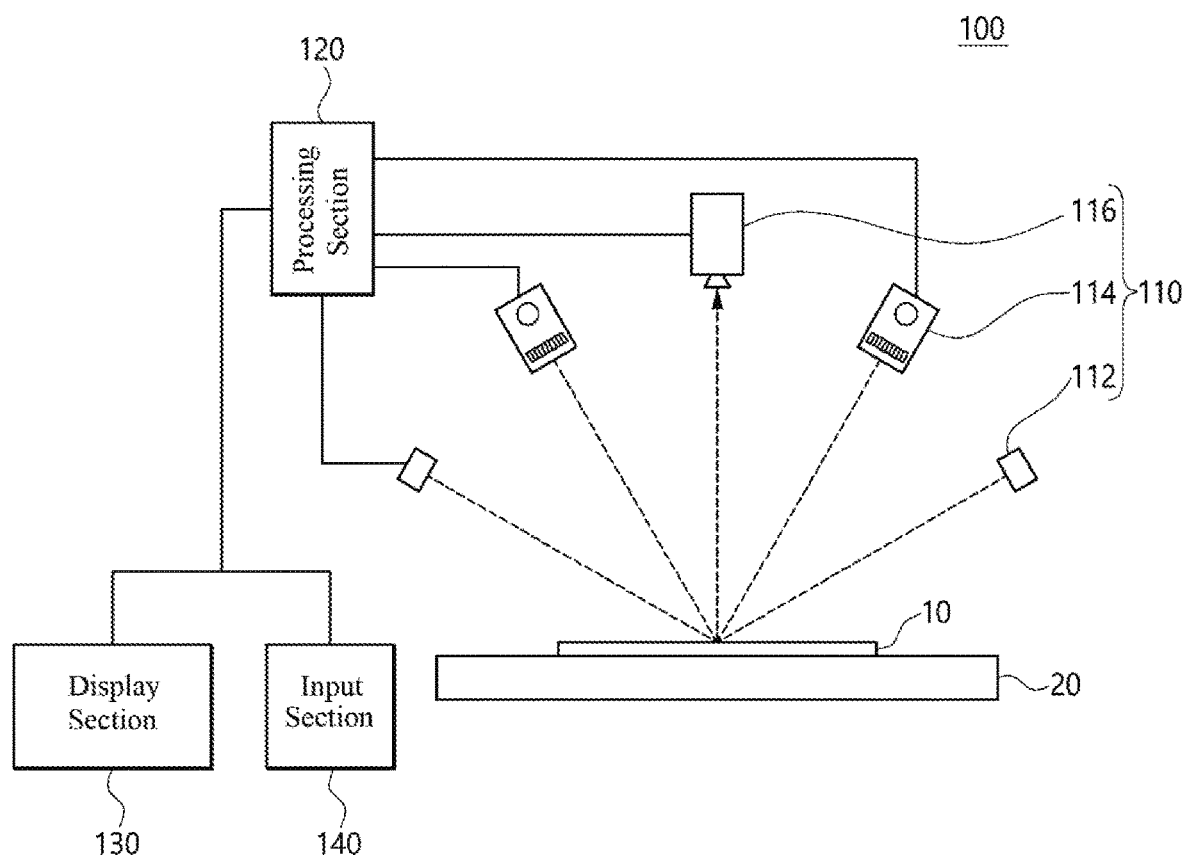
FIG. 1 is a conceptual view of a board inspecting apparatus according to an exemplary embodiment of the present invention.

The present invention is described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that, although the terms first, second, etc. may be used herein to describe various elements, these elements should not be limited by these terms. These terms are only used to distinguish one element from another element. For example, a first element discussed below could be termed a second element, and similarly, a second element may also be termed a first element, without departing from the teachings of the present invention.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, components, and/or groups thereof but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs.

It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The present invention may be illustrated as being implemented in a suitable computing environment. In addition, various methods according to the present invention may be provided as a recording medium that records a computer-software for implementing the methods.

The recording medium typically includes a variety of computer readable media, and may be provided as any available media that can be accessed by a computer. Further, the recording medium includes volatile or non-volatile media, removable or non-removable media, etc. For example, the recording medium may include all the media implemented in any method or technology for storage of information such as computer readable instructions, data structures, program modules or other data. In addition, the recording medium includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by a computer.

Hereinafter, exemplary embodiments of the present invention will be described in detail with reference to the accompanying drawings.

FIG. 1 is a conceptual view of a board inspecting apparatus according to an exemplary embodiment of the present invention.

Referring to FIG. 1, a board inspecting apparatus 100 according to an embodiment of the present invention includes a measuring section 110, a processing section 120, and a display section 130.

The measuring section 110 obtains measurement data for at least a portion of the board 10.

The board 10 may be placed on a stage 20 and the stage 20 may be transferred to a predetermined position by control of the processing section 120 described later or by control of an externally provided transfer apparatus.

The measurement data may include a real photographed image of the board 10 or related data.

In one embodiment, the measuring section 110 may include a first illumination part 112, a second illumination part 114, and an image-capturing part 116, and the measurement data may include a captured image obtained at the image-capturing part 116.

The first illumination part 112 may provide non-patterned illumination. The non-patterned illumination may be, for example, an illumination to obtain a plane image of the two-dimensional shape of the measurement target formed on the board 10. The plane image may include at least one information of color, brightness or brightness, and saturation of the measurement target.

In one embodiment, the first illumination part 112 may include a plurality of illumination units arranged in a circular shape on the basis of the measurement target, which is a measurement object, when viewed in a plane view, to irradiate light. For example, the first illumination part 112 may include a light source that emits white light or monochromatic light of a predetermined color, and may irradiate a plurality of different color lights such as red, green, and blue at different inclination angles. In the first illumination part 112, a plurality of LEDs may be continuously arranged so as to respectively have a ring shape.

The second illumination part 114 may provide pattern illumination. The pattern illumination may be, for example, an illumination for acquiring a pattern image from which a three-dimensional shape of the measurement target may be extracted. In one embodiment, the second illumination part 114 may include a plurality of pattern illumination units arranged to obliquely irradiate grating pattern light in different directions toward the measurement target. For example, the second illumination part 114 may illuminate the grating pattern light forming a grating pattern for obtaining three-dimensional shape information of the measurement target, obliquely based on a normal line perpendicular to the plane of the measurement target. Also, the second illumination part 114 may be disposed apart from each other along the circumferential direction about the measurement target, or may be arranged at each vertex of a polygon in which the measurement target is centered. The second illumination part 114 may be alternately arranged at regular intervals in a position to divide a circumference. The pattern illumination units of the second illumination part 114 may be provided with M (M is a natural number greater than or equal to 2), and for example, may be provided with various numbers of 2, 4, or 8.

In one embodiment, each pattern illumination unit of the second illumination part 114 may illuminate the grating pattern light N times toward the measurement target (N is a natural number greater than or equal to 2). In order to illuminate phase-shifted grating pattern light, the pattern illumination unit may transfer grating pattern N times, by using a pattern image employing a digital light processing (DLP) method using a digital micro-mirror display (DMD), or a pattern image of a liquid crystal display device, and may transfer grating pattern by using a pattern image of various display method. Alternatively, the grating pattern may be physically transferred N times by using a grating transfer mechanism.

The image-capturing part 116 may obtain a two-dimensional plane image of the measurement target based on the non-patterned illumination of the first illumination part 112, and may obtain a pattern image of the measurement target based on the patterned illumination of the second illumination part 114. From the pattern image, a three-dimensional shape of the measurement target may be calculated, for example, by applying a method such as a bucket algorithm. On the other hand, the image-capturing part 116 may be provided with K (K is a natural number greater than or equal to 1), and may be arranged at various angles based on a normal line perpendicular to the plane of the measurement target. Also, the second illumination part 114 of the measuring section 110 may be provided with L (L is a natural number greater than or equal to 1), so that the measuring section 110 may include various types such as 1: K, L: 1, L: K, and the like between the second illumination part 114 and the image-capturing part 116.

The measurement data may include a captured image such as a two-dimensional plane image obtained from the image-capturing part 116. In addition, the board 10 may be inspected using the two-dimensional plane image and/or the pattern image.

The processing section 120 performs distortion compensation of the board 10 by comparing the measurement data of the board 10 with previously obtained reference data of the board 10, based on a plurality of feature objects set on the board 10. In addition, the processing section 120 may perform various inspections for the board 10 with distortion compensation. For example, the processing section 120 may include a computer or a central processing part of a computer, and may include a control device performing a similar function.

Particularly, since there may be distortion in the inspection area set for the inspection of the board 10, a predetermined feature object is established on the board in order to set the inspection area with distortion compensation, and the compensation may be performed by judging distortion of the inspection area based on the feature object. In this case, the feature object is a reference for comparing the measurement data of the board 10 and the previously obtained reference data of the board, and distortion compensation may be performed by comparing the feature object of the measurement data and the feature object of the reference data for associated feature objects.

In one embodiment, between known reference data or reference data taught according to a teaching mode and the measurement data such as a captured image, the distortion of the board is determined from the change of the feature object caused by the distortion of the board 10, and then more accurate inspection may be performed by setting the inspection area with distortion compensation. For example, changes in the feature object may include changes in shape, changes in size, changes in a distance between the feature objects, changes in a geometry between the feature objects, and so on.

The establishment of the feature object may be done by user input via an input section described below or automatically by the processing section 120.

The distortion of the board 10 may occur in various forms due to various causes. For example, the board 10 may include distortion being such as bent, twisted, curved, rugged, etc., which are formed locally or globally due to the cause of manufacturing or handling. In one embodiment, the distortion compensation of the board 10 may include warpage compensation of the board.

The reference data may be a theoretical plane image for the board 10.

In one embodiment, the reference data may be obtained from CAD information or gerber information, which record the shape for the board 10. The CAD information or gerber information includes design reference information of the board, and generally includes layout information about pads, circuit patterns, circular patterns, and so on.

In another embodiment, the reference data may be obtained from teaching information obtained by a teaching mode. In the teaching mode, for example, board information is searched in the database, and in case that board information is not available as a search result of the database, teaching of a bare board is performed. Then, the teaching of the bare board is completed and when board information such as pad and wiring information of the bare board is calculated, the board information is stored in the database. That is, the design reference information of a printed circuit board may be obtained by teaching the bare board of the printed circuit board in the teaching mode, and the reference data may be obtained by acquiring the teaching information through the teaching mode.

The reference data may be obtained in advance, and the measurement data may be distorted compared with the reference data due to bending, twisting, etc. of the board. Thus, by comparing the reference data with the measurement data, distortion compensation of the board 10 may be performed and the board 10 with distortion compensation may be inspected.

In this case, plurality of feature objects set on the board 10 may be used as a basis of the comparison. The feature objects may include a fiducial, a hole pattern, a corner portion of a curved circuit pattern and the like, which are formed on the board 10. By comparing the reference data with the measurement data based on the coordinates of the center point of the hole pattern or the coordinates of the corner point of the curved circuit pattern, the distortion of the measurement data for the reference data, i.e., a conversion relationship between the reference data and the measurement data, which will be described later, may be obtained.

The display section 130 displays an image for inspection of the board 10. For example, the display section 130 may include a display device such as a monitor connected to the processing section 120. A user may perform an inspection of the board 10 using various videos and selection options displayed in the display section 130.

The display section 130 displays an inspection speed according to the distortion compensation and a precision of the distortion compensation, and the inspection speed and the precision are determined in a trade-off relationship.

Figure 2:
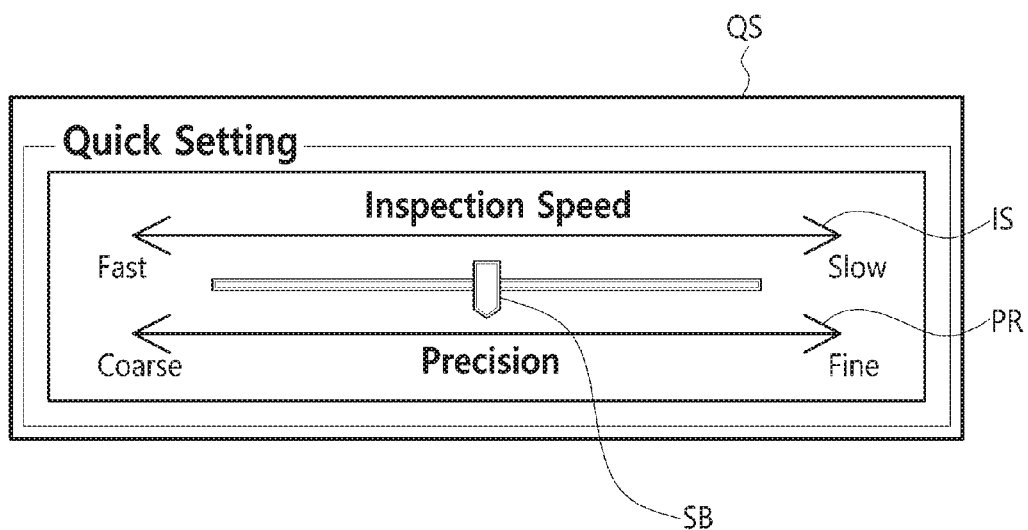
FIG. 2 is a conceptual view for explaining an interface for setting an inspection speed and a precision in the board inspecting apparatus in FIG. 1.

FIG. 2 is a conceptual view for explaining an interface for setting an inspection speed and a precision in the board inspecting apparatus in FIG. 1.

Referring to FIGS. 1 and 2, the display section 130 displays ranges for adjusting a first level of an inspection speed IS according to the distortion compensation and a second level of a precision PR of the distortion compensation. The inspection speed IS means a degree indicating how fast the inspection according to the distortion compensation is performed, and the precision PR means a degree indicating how precisely the distortion compensation is performed. For example, for the display, a "Quick Setting" window QS may be provided as a user interface (UI) as shown in FIG. 2.

The inspection speed IS and the precision PR are determined in a trade-off relationship with each other. The precision PR may include various options to further refine the distortion compensation, and generally, additional time is required to process these options. Thus, when performing an option to increase the precision PR, the inspection speed IS may be slower, and in order to increase the inspection speed IS, options for increasing the precision PR are performed may not be performed. Therefore, the inspection speed IS and the precision PR are determined to have a trade-off relationship with each other, and an interface for adjusting levels of the inspection speed IS and the precision PR may be provided as a form of the quick setting window QS.

In one embodiment, the board inspecting apparatus 100 may further include an input section 140. The input section 140 receives an input for a first level of the inspection speed IS and a second level of the precision PR from a user.

The input section 140 may receive the first level and the second level from the user so that the first level and the second level are simultaneously selected as the previously determined setting combination. That is, since the first level of the inspection speed IS and the second level of the precision PR are set in a trade-off relationship with each other, an interface may be provided so that the first level and the second level are selected as a setting combination that is specified to have a trade-off relationship by a user. Therefore, when any one of the first level of the inspection speed IS and the second level of the precision PR is selected, a remaining level corresponding to the selected level is automatically specified. For example, the first level and the second level may be discrete or continuous.

For example, the input section 140 may include at least one of a computer keyboard, a mouse, a touch pad, and a touch panel. The input section 140 may include other input means as long as an input from a user is available.

The input section 140 may receive various commands necessary for the board inspection of the board inspecting apparatus 100 from a user in addition to inputting the inspection speed IS and the precision PR. For example, the input section 140 may receive a setting command of a feature object.

The display section 130 may display the inspection speed IS and the precision PR as a first step and a second steps, respectively, which are discrete. For example, the first step of the inspection speed IS may be represented by three discontinuous steps of "high (Fast)", "medium (Normal)" and "low (Slow)" depending on the fast degree, and the second step of the precision PR may be represented by three discontinuous steps of "high (Fine)", "medium (Normal)" and "low (Coarse)" depending on the precise degree.

Thus, the first step and the second step may be represented by three discontinuous setting combinations of a "high-low" combination, a "medium-medium" combination, and a "low-high" combination, and an interface may be provided so that a user select the inspection speed IS and the precision PR as a setting combination having a trade-off relationship.

For example, as shown in FIG. 2, a sliding bar SB may be provided in the quick setting window QS, and a user may select the above-mentioned discontinuous setting combination by adjusting the sliding bar SB.

Although the first level and the second level are respectively displayed by three discontinuous steps, and the setting combination is also illustrated as being displayed by three discontinuous setting combinations as described above, the first level and the second level may be displayed by two steps or four or more steps, and accordingly the setting combination may be displayed by two step combinations or four or more step combinations.

The board inspecting apparatus 100 may be provided with a plurality of options for increasing the precision of the distortion compensation, and the setting combinations may be selected in association with the plurality of options.

For example, a plurality of options for increasing the precision of the distortion compensation may include an offset compensation option, an ROI compensation option, an enhancement model option, and the like. The options may have a range of data utilized for compensation. The offset compensation option is an option to compensate for distortion by correcting an offset after measuring solder. The ROI compensation option is an option to compensate for distortion by correcting an inspection area or a region of interest (ROI) before measuring solder. The enhancement model option is an option to compensate for distortion by increasing a pixel precision of a compensation model.

In one embodiment, when the inspection speed IS and the precision PR are established, a specific option corresponding to the established inspection speed IS and the established precision PR among a plurality options for increasing the precision of the warpage compensation may be automatically designated so that the specific option is applied.

For example, when the first level and the second level are set to three discontinuous setting combinations of a "high-low" combination, a "medium-medium" combination, and a "low-high" combination, only the offset compensation among the three options may be applied in the "high-low" combination, the ROI compensation in addition to the offset compensation among the three options may be further applied in the "medium-medium" combination, and all the three options may be applied in the "low-high" combination.

In another embodiment, when the inspection speed IS and the precision PR are established, an application scope of a specific option corresponding to the established inspection speed and the established precision among a plurality options for increasing the precision of the distortion compensation may be automatically set.

For example, when the first level and the second level are set to three discontinuous setting combinations of a "high-low" combination, a "medium-medium" combination, and a "low-high" combination, the application scope such as the number of the feature objects used in the ROI compensation, the pixel precision of the enhancement model and the like may be determined according to the setting combinations.

Meanwhile, the display section 130 may display the inspection speed IS and the precision PR as a first weight ratio and a second weight ratio, respectively, which are continuous. For example, the first weight ratio of the inspection speed IS may be displayed in the range of 0% to 100% depending on the fast degree, and the second weight ratio of the precision PR may be displayed as 0%/o to 100% depending on the precise degree.

Thus, the first weight ratio and the second weight ratio may be displayed by various combinations of continuous setting combinations such that the sum thereof is 100%. For example, the first weight ratio and the second weight ratio may be selected to be 64% and 36%, respectively, and when the first weight ratio is increased to 68%, the second weight ratio is forced to 32%. In this way, an interface may be provided for a user to select the inspection speed IS and the precision PR as a setting combination of a trade-off relationship.

For example, a user may continuously move the slide bar SB to a specific point, and at any point including the specific point, the sum of the first weight ratio and the second weight ratio may be always 100%.

In this case, when the inspection speed IS and the precision PR are established, an application scope of a specific option corresponding to the established inspection speed and the established precision among a plurality options for increasing the precision of the distortion compensation may be automatically set.

For example, when the first level and the second level are located at a specific point and the first weight ratio and the second weight ratio are set, the application scope such as the number of the feature objects used in the ROI compensation, the pixel precision of the enhancement model and the like may be determined according to a criterion predetermined corresponding to the first weight ratio and the second weight ratio.

As described above, the board inspecting apparatus 100 provides an interface for selecting a setting combination having a trade-off relationship between the inspection speed and the precision for compensating the distortion of the board 10, to thereby improve user's convenience and allow a user to easily set options for distortion compensation.

Figure 3:
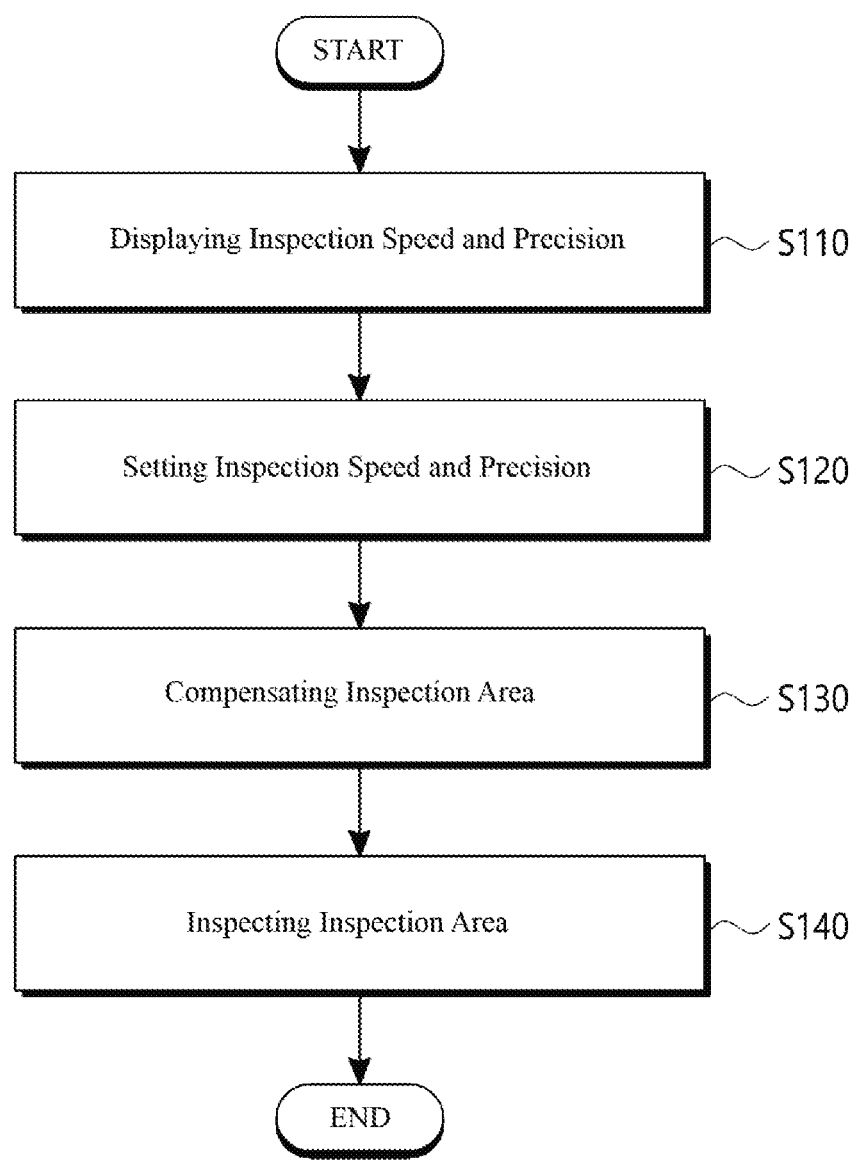
FIG. 3 is a flow chart showing a board inspecting method according to an exemplary embodiment of the present invention.

FIG. 3 is a flow chart showing a board inspecting method according to an exemplary embodiment of the present invention.

Referring to FIGS. 1 to 3, in order to inspect a board 10 according to an exemplary embodiment of the present invention, first, the inspection speed IS according to the distortion compensation and the precision PR of the distortion compensation are displayed in step of S110.

For example, as described above, the display section 130 displays ranges for adjusting levels of the inspection speed IS required by the distortion compensation and the precision PR of the distortion compensation, and a quick setting window QS may be provided as a user interface.

Then, the inspection speed IS and the precision PR are inputted as a setting combination that is specified to have a trade-off relationship in step of S120.

For example, as described above, the input section 140 may receive the inspection speed IS and the precision PR from a user in the quick setting window QS, and the processing section 120 may set the inspection speed IS and the precision PR based on the input information.

In addition, the inspection speed IS and the precision PR may be displayed as a first level and a second level, respectively, by the display section 130. The first level and the second level may be simultaneously selected as a specific setting combination having a trade-off relationship by a user.

For example, the first level of the inspection speed IS and the second level of the precision PR may be displayed, by the display section 130, as discrete first and second steps, respectively, or as a continuous first and second weight ratios, respectively.

Thereafter, according to the inspection speed IS and the precision PR, the distortion of the board is compensated based on the feature object on the board in step of S130.

For example, as described above, according to the inspection speed IS and the precision PR, the processing section 120 may automatically designate a specific option to be applied, or set an application scope of a specific option.

Accordingly, the processing section 120 compares measurement data of the board 10 and previously obtained reference data of the board on the basis of the feature object and performs distortion compensation of the board 10.

Then, an inspection area of the board in which the distortion is compensated is inspected in step of S140.

For example, as described above, the processing section 120 may perform various types of inspections for defectiveness of the board 10 in which the distortion is compensated.

According to the board inspecting apparatus and the board inspecting method using the same, an interface for selecting an inspection speed and a precision for distortion compensation of a board as a specific setting combination having a trade-off relationship with each other is provided, and a specific option corresponding to the inspection speed and the precision is applied by the selection of the setting combination, thereby improving user's convenience and allowing a user to easily set options for distortion compensation.

In addition, when the inspection speed and the precision are displayed, the level of the inspection speed and the level of the precision are displayed in discrete steps or continuous weight ratios, thereby further improving user's convenience.

It will be apparent to those skilled in the art that various modifications and variations may be made in the present invention without departing from the spirit or scope of the invention. Thus, it is intended that the present invention cover the modifications and variations of this invention provided they come within the scope of the appended claims and their equivalents.

The invention claimed is:

1. A board inspecting apparatus, comprising:
    a measuring section obtaining measurement data for at least a portion of a board;
    a processing section comparing the measurement data of the board and previously obtained reference data of the board, based on a plurality of feature objects set on the board, to perform warpage compensation for the board, and inspecting the board in which warpage is compensated; and
    a display section displaying ranges for adjusting a first level of an inspection speed according to the warpage compensation and a second level of a precision of the warpage compensation; and
    an input section receiving, from a user, an input for the first level of the inspection speed and the second level of the precision as a setting combination that is specified to have a trade-off relationship,
    wherein the processing section, when the inspection speed and the precision are established, designates a specific option corresponding to the established inspection speed and the established precision among a plurality options for increasing the precision of the warpage compensation so that the specific option is applied.

2. The board inspecting apparatus of claim 1, wherein the display section displays the first level and the second level, respectively, as a first step and a second step which are discrete, or as a first weight ratio and a second weight ratio which are continuous.

3. A board inspecting method using a board inspecting apparatus performing warpage compensation of a board serving as a measurement target and inspecting the board with warpage compensated, the board inspecting method being performed by the board inspecting apparatus, the board inspecting method comprising:

displaying ranges for adjusting a first level of an inspection speed according to the warpage compensation and a second level of a precision of the warpage compensation;

receiving, from a user, an input for the first level of the inspection speed and the second level of the precision as a setting combination that is specified to have a trade-off relationship;

compensating warpage of the board based on feature object on the board, according to the setting combination of the first level of the inspection speed and the second level of the precision; and inspecting an inspection area of the board in which the warpage is compensated;

wherein in compensating warpage of the board, when the inspection speed and the precision are established, a specific option corresponding to the established inspection speed and the established precision among a plurality options for increasing the precision of the warpage compensation is designated so that the specific option is applied.

4. The board inspecting method of claim 3, when displaying the first level and the second level, wherein the first level and the second level is respectively displayed as:

a first step and a second step which are discrete, or a first weight ratio and a second weight ratio which are continuous.

5. A computer readable non-transitory recording medium recording a program implementing the board inspecting method of claim 4.

6. A computer readable non-transitory recording medium recording a program implementing the board inspecting method of claim 3.

* * * * *